(12) United States Patent
Hauptmann et al.

(10) Patent No.: US 6,340,945 B1
(45) Date of Patent: Jan. 22, 2002

(54) ANALOG/DIGITAL CONVERTER

(75) Inventors: Jörg Hauptmann, Wernberg; Christian Schranz, Villach, both of (AU)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/875,971

(22) Filed: Jun. 8, 2001

Related U.S. Application Data

(63) Continuation of application No. PCT/DE99/03927, filed on Dec. 8, 1999.

(30) Foreign Application Priority Data

Dec. 10, 1998  (DE) .......................... 198 57 042

(51) Int. Cl.[7] .......................... H03M 1/12; H03M 1/00
(52) U.S. Cl. .................................. 341/172; 341/150
(58) Field of Search ........................ 341/155, 150, 341/144, 166, 172

(56) References Cited

U.S. PATENT DOCUMENTS

| | | | |
|---|---|---|---|
| 4,764,753 A | * 8/1988 | Yukawa | 341/166 |
| 5,440,306 A | * 8/1995 | Tatsumi | 341/150 |
| 5,627,536 A | 5/1997 | Ramirez | |
| 5,852,416 A | * 12/1998 | Ohmi et al. | 341/144 |

FOREIGN PATENT DOCUMENTS

EP  762656  3/1997

OTHER PUBLICATIONS

The Design of Sigma–Delta Modulation Analog–to–Digital Converters, by B.E. Boser et al., IEEE Journal of Solid State Circuits, vol. SC–23, pp. 1298–1308, Dec. 1988.
A 14–Bit 80–kHz Sigma–Delta A/D Converter: Modeling, Design and Performance Evaluation, by S.R. Norsworthy et al., IEEE Journal of Solid–State Circuits, vol. SC–24, pp. 256–266, Apr. 1989.

* cited by examiner

*Primary Examiner*—Patrick Wamsley
(74) *Attorney, Agent, or Firm*—Greenblum & Bernstein, P.L.C.

(57) ABSTRACT

The present invention is related to an analog/digital converter which includes a multitude of integrating circuits, a 1 bit analog/digital converter and a 1 bit digital/analog converter. The multitude of analog integrating circuits are connected in series and the 1 bit digital/analog converter is connected downstream from the last analog integrating circuit of the series. An output signal of the 1 bit analog/digital converter is transmitted to the 1 bit digital/analog converter, and an output signal of the 1 bit digital/analog converter is subtracted from an input signal of each analog integrating circuit. A multitude of input signals is transmitted via a multiplexer to the first analog integrating circuit of the series-connected analog integrating circuits. Each analog integrating circuit includes a multitude of capacitors which correspond to the multitude of input signals, whereby a capacitor of the multitude of capacitors can be switched each time between an output and an input of the analog integrating circuit. The output signal of the 1 bit digital/analog converter is delayed according to the multitude of input signals.

17 Claims, 1 Drawing Sheet

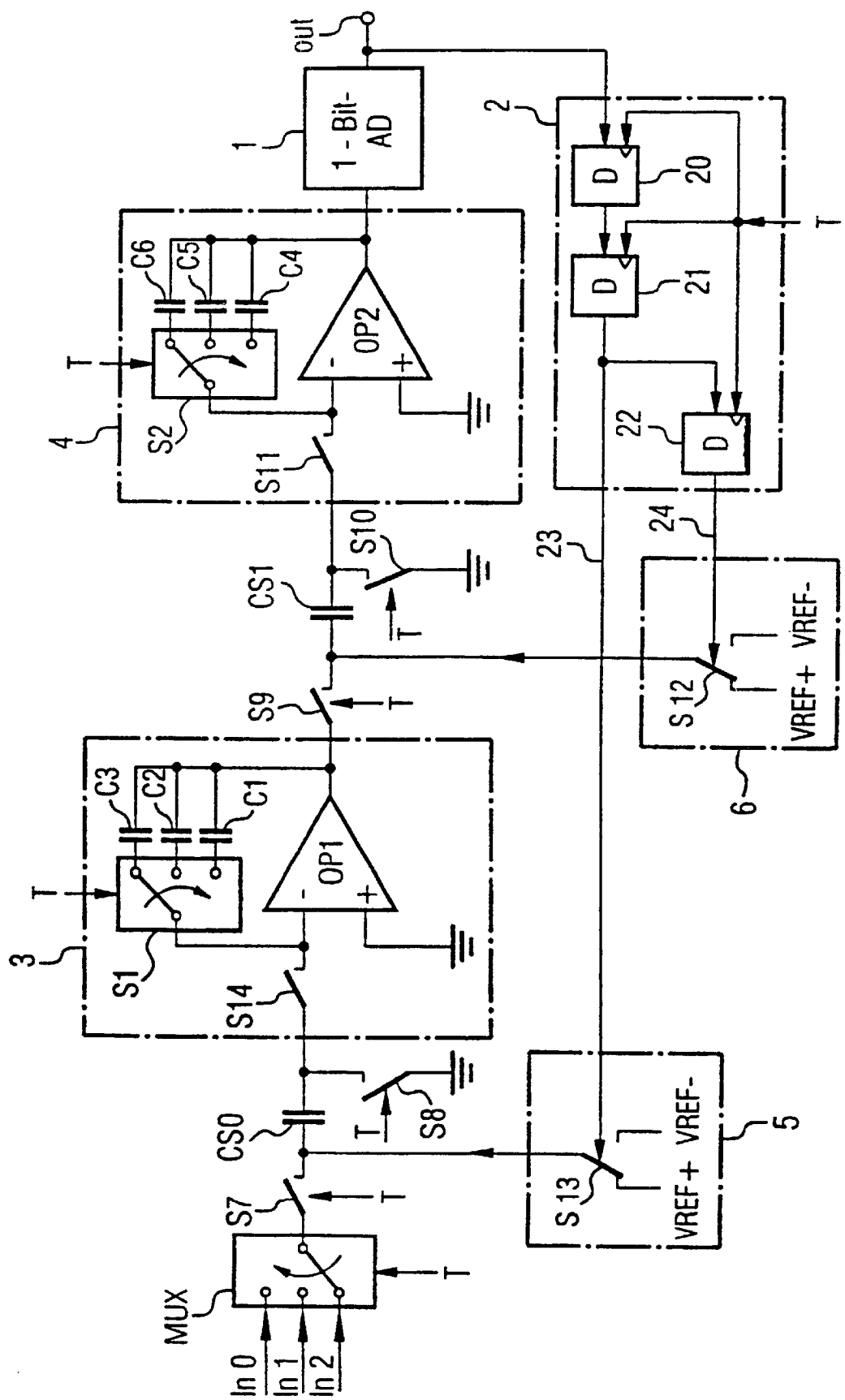

ANALOG/DIGITAL CONVERTER

This is a continuation of International Application No. PCT/DE99/03927, filed Dec. 8, 1999, the contents of which are expressly incorporated by reference herein in its entirety. The International Application was not published under PCT Article 21(2) in English.

The invention relates to an analog/digital converter.

EP-A-0 762 656 discloses an analog/digital converter which operates on the basis of the sigma-delta principle and is able to process a multiplicity of input signals in time-division multiplex mode. The converter contains a 1-bit analog/digital converter, a one-bit digital analog converter and also a single integrator circuit. A multiplicity of input signals are supplied to the integrator circuit via a multiplexer. The analog integrator circuit contains a multiplicity of capacitances in accordance with the multiplicity of input signals. The capacitances are connected indirectly between an input and an output of an operational amplifier. The output signal from the 1-bit digital/analog converter is fed back to the input of the integrator circuit with a delay. The delay by one period is in accordance with the two input signals of the circuit.

Analog/digital converters operating on the basis of the sigma-delta method produce a 1-bit data stream from a repeatedly oversampled analog input signal. A first-order sigma-delta analog/digital converter has a feedback structure in which the digital output signal is fed back to the negative input of an adder via a digital/analog converter. The adder subtracts the fed-back analog signal from the oversampled analog input signal, integrates the difference signal using an analog integrator circuit and converts the output signal from the analog integrator circuit into a digital output signal using a 1-bit analog/digital converter. nth-order sigma-delta analog/digital converters have n analog integrator circuits connected in series, with the feedback signal being routed to the input of each of the n integrator circuits.

"The Design of Sigma-Delta Modulation Analog-to-Digital Converters", B. E. Boser, B. A. Wooley, IEEE Journal of Solid State Circuits, vol. SC-23, pp. 1298–1308, December 1988 describes the basic principles of sigma-delta A/D conversion and shows, in FIG. 10, the circuit diagram for a second-order sigma-delta A/D converter which converts a differential analog input signal into a digital output signal.

"A 14-Bit 80-kHz Sigma-Delta A/D Converter: Modeling, Design and Performance Evaluation", S. R. Norsworthy, I. G. Post, H. S. Fetterman, IEEE Journal of Solid-State Circuits, vol. SC-24, pp. 256–266, April 1989 likewise shows, in FIG. 6, the circuit diagram for a second-order sigma-delta A/D converter. Since a sigma-delta converter has feedback and internal state memories and needs to reach a steady state in order to achieve a small conversion error, it is a difficult matter to process a multiplicity of input signals which are supplied to the converter in time-division multiplex mode.

U.S. Pat. No. 5,627,536 discloses a sigma-delta analog/digital converter for converting a multiplicity of signals supplied in time-division multiplex mode. Before each analog sample which is to be converted, the internal state memories of the converter need to be reset, and the converter needs to reach a steady state again in order to convert each sample. The disadvantage of this is that it reduces the conversion rate of the sigma-delta analog/digital converter.

The technical problem on which the invention is based is therefore that of specifying a sigma-delta analog/digital converter which is able to process a multiplicity of input signals supplied to the converter in time-division multiplex mode, where the conversion rate is not reduced by settling times of the sigma-delta analog/digital converter.

This problem is solved by a sigma-delta analog/digital converter having the features of patent claim 1. Advantageous refinements of the sigma-delta analog/digital converter can be found in the respective dependent claims.

An analog/digital converter has a multiplicity of integrator circuits, a 1-bit analog/digital converter and a 1-bit digital/analog converter. The multiplicity of analog integrator circuits are connected in series, and the 1-bit analog/digital converter is connected downstream of the last analog integrator circuit in the series. An output signal from the 1-bit analog/digital converter is supplied to the 1-bit digital/analog converter, and an output signal from the 1-bit digital/analog converter is subtracted from an input signal of each analog integrator circuit. A multiplicity of input signals are supplied via a multiplexer to the first analog integrator circuit from the analog integrator circuits connected in series, and each analog integrator circuit has a multiplicity of capacitances in accordance with the multiplicity of input signals. In this context, a respective capacitance from the multiplicity of capacitances can be connected between an output and an input of an operational amplifier in each analog integrator circuit, so that a feedback capacitance is formed. The output signal from the 1-bit digital/analog converter is delayed in accordance with the multiplicity of input signals. Advantageously, the multiplicity of capacitances in each analog integrator circuit form state memories. Each input signal from the multiplicity of input signals has an associated capacitance from the multiplicity of capacitances in each analog integrator circuit. The analog/digital converter can also be designed for differential input signals. In this case, each differential input signal from the multiplicity of differential input signals has two associated capacitances, so that each analog integrator circuit has, in total, twice as many capacitances as it does the multiplicity of differential input signals. Another advantage of the invention is the reduced circuit complexity for processing a multiplicity of input signals, since, instead of a multiplicity of sigma-delta analog/digital converters in accordance with the multiplicity of input signals, each analog integrator circuit is merely provided with a multiplicity of capacitances in accordance with the multiplicity of input signals in each case. This advantageously saves chip area when the sigma-delta analog/digital converter is integrated on one chip.

According to the invention, the output signal from the 1-bit digital/analog converter is delayed by a shift register, the shift register having a multiplicity of outputs in accordance with the multiplicity of analog integrator circuits. Each of the multiplicity of outputs is supplied to a respective input of one of the multiplicity of analog integrator circuits, so that the correct output signal from the 1-bit digital/analog converter is supplied to an analog integrator circuit.

According to the invention, the shift register is clocked by a clock signal which additionally clocks, in parallel, a multiplicity of sampling switches. Sampling switches are connected upstream of each analog integrator circuit, and the clock signal causes a respective capacitance from the multiplicity of capacitances to be connected between an output and an input of the operational amplifier in each analog integrator circuit. The clock signal thus controls the flow of conversion of the multiplicity of input signals.

In another particularly preferred embodiment, the multiplicity of outputs of the shift register are each delayed with respect to one another by one clock period of the clock signal. This means that signals associated with various input signals are present at each output of the shift register.

In one particularly preferred embodiment of the shift register, a first output from the multiplicity of outputs of the shift register is delayed by clock periods in accordance with the number of input signals reduced by one, and each further output from the multiplicity of outputs of the shift register is delayed by one respective further clock period.

In one particularly preferred embodiment, the multiplicity of capacitances in each analog integrator circuit have identical capacitance values. Integrated circuits advantageously allow the ratio to be set very much more accurately, in contrast with the absolute values of capacitances, and also the integration time period for each input signal is the same with identical capacitance values. In one preferred embodiment, the gain factor of each analog integrator circuit is determined by the ratio of a capacitance connected upstream of the input of the operational amplifier and a capacitance from the multiplicity of capacitances.

In one particularly preferred embodiment, the gain factor of each analog integrator circuit is 0.5.

In one preferred embodiment, the capacitance values of the multiplicity of capacitances in the first analog integrator circuit are larger than the capacitance values of the multiplicity of capacitances in the other analog integrator circuits.

Other advantages, features and opportunities for application of the invention can be found in the description below of illustrative embodiments in conjunction with the drawing. In the drawing FIG. 1 shows an illustrative embodiment of a sigma-delta A/D converter based on the invention for converting three analog input signals.

FIG. 1 shows a sigma-delta analog/digital converter designed using switched-capacitor technology.

A first analog input signal In0, a second analog input signal In1 and a third analog input signal In2 are supplied to a multiplexer MUX. The three analog input signals need to be band-limited to at least half the sampling frequency at which the sigma-delta analog/digital converter operates. The multiplexer's three input signals In0, In1 and In2 are switched to an output of the multiplexer MUX cyclically with a clock signal T. The output of the multiplexer thus produces a signal which has time slots having a duration in accordance with the period duration of the clock signal T and is formed from the first analog input signal In0, the second analog input signal In1 and the third analog input signal In2.

The output signal from the multiplexer is sampled using a first sampling switch S7 and a third sampling switch S8. Connected between the first sampling switch S7 and the third sampling switch S8 is a first capacitor CS0. When the first sampling switch S7 and the third sampling switch S8 are on, the first capacitor CS0 is charged by the output signal from the multiplexer MUX. Both the first sampling switch S7 and the third sampling switch S8 are controlled by the clock signal T.

A signal produced at an output of the first analog integrator circuit 3 is sampled using a second sampling switch S9 and a fourth sampling switch S10. Connected between the second sampling switch S9 and the fourth sampling switch S10 is a second capacitor CS1. When the second sampling switch S9 and the fourth sampling switch S10 are on, the second capacitor CS1 is charged by the output signal from the first analog integrator circuit 3. The second sampling switch S9 and the fourth sampling switch S10 are both controlled by the clock signal T.

The output signal from the second analog integrator circuit 4 is supplied to a 1-bit analog/digital converter 1. The 1-bit analog/digital converter 1 converts the supplied, sampled signal into a 1-bit data stream. Usually, the one-bit analog/digital converter comprises a simple comparator circuit.

The 1-bit data stream is supplied to a shift register 2. The shift register 2 delays the 1-bit data stream by clock periods in accordance with the multiplicity of input signals. The shift register has a first register 20, a second register 21 and a third register 22, which are controlled by the clock signal T. The first register 20 receives the 1-bit data stream from the 1-bit analog/digital converter 1. Connected downstream of the first register 20 is the second register 21. The first register 20 and the second register 21 delay the 1-bit data stream by two clock cycles of the clock signal T. The output of the second register 21 forms a first output 23 of the shift register 2. Connected downstream of the second register 21, in parallel with the first output 23, is the third register 22, whose output in turn forms a second output 24 of the shift register 2.

The first output 23 of the shift register 2 is supplied to a first changeover switch 5. The second output 24 of the shift register 2 is supplied to a second changeover switch 6.

The first changeover switch 5 has a third switch S13, which connects an output of the first changeover switch 5 to a first reference voltage Vref+ or to a second reference voltage Vref–.

The second changeover switch 6 has a second switch S12, which connects an output of the second changeover switch 6 to the first reference voltage Vref+ or to the second reference voltage Vref–.

The first changeover switch 5 and the second changeover switch 6 form a respective 1-bit digital/analog converter. The first changeover switch 5 is controlled by the 1-bit data stream from the 1-bit analog/digital converter 1 delayed by two clock cycles of the clock signal T. The second changeover switch 6 is controlled by the 1-bit data stream from the 1-bit analog/digital converter 1 delayed by three clock cycles of the clock signal T.

A signal produced at the output of the first changeover switch 5 is supplied to the input of the first analog integrator circuit 3. An output signal at the output of the second changeover switch 6 is supplied to the second analog integrator circuit 4.

The first analog integrator circuit 3 has a first operational amplifier OP1. Connected upstream of an inverting input of the first operational amplifier OP1 is a fourth switch S14, which forms the input of the first analog integrator circuit 3. A noninverting input of the first operational amplifier OP1 is connected to the reference-ground potential VSS. An output of the first operational amplifier OP1 forms the output of the first analog integrator circuit. The output of the first operational amplifier OP1 can be connected to the inverting input of the first operational amplifier OP1 via a third changeover switch SI and one of three capacitances C1, C2 and C3. In this context, the third changeover switch S1, which is a multiplexer, connects one of the three capacitances C1, C2 or C3 between the output of the first operational amplifier OP1 and the inverting input of the first operational amplifier OP1 and is controlled by the clock signal T. This means that a respective one of the three capacitances can be connected as feedback capacitance for the operational amplifier.

The second analog integrator circuit 4 has a second operational amplifier OP2. Connected upstream of an inverting input of the second operational amplifier OP2 is a first switch S11, which forms the input of the second analog integrator circuit 4. A noninverting input of the second operational amplifier OP2 is connected to the reference-ground potential VSS. An output of the second operational amplifier OP2 forms the output of the second analog integrator circuit OP4. The output of the second operational amplifier OP2 can be connected to the inverting input of the second operational amplifier OP2 via a fourth changeover switch S2 and one of three capacitances C4, CS and C6. In this context, the fourth changeover switch S2, which is a multiplexer, connects one of the three capacitances C4, CS or C6 between the output of the second operational amplifier OP2 and the inverting input of the second operational amplifier OP2 and is controlled by the clock signal T. This means that a respective one of the three capacitances can be connected as feedback capacitance for the operational amplifier.

An attempt should be made to keep the three capacitances C1 to C3 or C4 to C6 in the first analog integrator circuit 3 and the second analog integrator circuit 4 as small as possible in order to minimize the output current from the operational amplifier OP1 or OP2 and hence the rise time. The three capacitances C4 to C6 in the second analog integrator circuit 4 can be smaller than the three capacitances C1 to C3 in the first analog integrator circuit 3, since (thermal) noise caused in the first analog integrator circuit is reduced by a first-order shaping function of the first analog integrator circuit.

In this case, each of the three analog input signals In0, In1 and In2 has a respective one of the three capacitances C1, C2 and C3 and C4, C5 and C6 in the first analog integrator circuit 3 and in the second analog integrator circuit 4 associated with it. The capacitances C1 to C3 and C4 to C6 form state memories for the analog integrator circuit's input signals which are to be integrated.

The sigma-delta analog/digital converter operates on the basis of the pipeline principle. The table below clarifies the state of the first analog integrator circuit 3, the second analog integrator circuit 4 and of the first register 20, the second register 21 and the third register 22 during various periods 1 to 7 of the clock signal T (the subscript indices indicate the clock period in which the analog input signal was present at the output of the multiplexer MUX):

| T | 3 | 4 | 20 | 21 | 22 |
|---|---|---|----|----|----|
| 1 | $In0_1$ | — | — | — | — |
| 2 | $In1_2$ | $In0_1$ | — | — | — |
| 3 | $In2_3$ | $In1_3$ | $In0_1$ | — | — |
| 4 | $In0_4$ | $In2_3$ | $In1_2$ | $In0_1$ | — |
| 5 | $In1_5$ | $In0_4$ | $In2_3$ | $In1_2$ | $In0_1$ |
| 6 | $In2_6$ | $In1_5$ | $In0_4$ | $In2_3$ | $In1_2$ |
| 7 | $In0_7$ | $In2_6$ | $In1_5$ | $In0_4$ | $In2_3$ |

Up to clock period 4, the sigma-delta analog/digital converter needs to reach a steady state, since the values stored in the second analog integrator circuit 4 and in the first to third registers 20 to 22 are initial values which have no connection with the three analog input signals In0 to In2. From the fifth clock period onward, the sigma-delta analog/digital converter is "filled" with samples of the analog input signals In0 to In2. It can be seen from the table that the output of the second register 21, which is fed back to the input of the first analog integrator circuit 3, has the analog input signal, which is also supplied to the input of the first analog integrator circuit 3 via the multiplexer MUX. The same applies for the second analog integrator circuit 4. The values indicated for the first and second analog integrator circuits naturally relate to the capacitance which forms the state memory for the respective value. The clock signal T connects the respective appropriate state memory or the respective appropriate capacitance to the operational amplifier in the analog integrator circuit.

On the basis of various parameters such as delay times of individual components, integration time constants etc., the clock signal should be matched to the respective component which is to be controlled. By way of example, care needs to be taken to ensure that signal delay times on the clock lines of the clock signal do not cause the individual clock periods to overlap, and hence result in conversion errors. Another example is the integration time period of the analog integrator circuits, which needs to be borne in mind. In this case, integration of one value needs to be finished before the next value is integrated. In this context, it may also be necessary to extend the delay of the shift register by the delay of half a period of the clock signal, for example.

The most critical component of the sigma-delta analog/digital converter is the operational amplifier which is held in the analog integrator circuit and needs to be selected very carefully with regard to the settling period and the rise time. In this context, it is of no significance that the operational amplifier has a short settling time. Rather, the operational amplifier needs to operate in the linear range during the settling time. In this context, the rise time should not limit the settling time.

| List of reference symbols | |
|---|---|
| 1 | 1-bit analog/digital converter |
| 2 | Shift register |
| 20–22 | 1-bit regist;ers |
| 3 | First analog integrator circuit |
| 4 | Second analog integrator circuit |
| 5 | First changeover switch |
| 6 | Second changeover switch |
| In0 | First input signal |
| In1 | Second input signal |
| In2 | Third input signal |
| MUX | Multiplexer |
| T | Clock signal |
| S1 | Third changeover switch |
| S2 | Fourth changeover switch |
| S7 | First sampling switch |
| S8 | Third sampling switch |
| S9 | Second sampling switch |
| S10 | Fourth sampling switch |
| S11 | First switch |
| S12 | Second switch |
| S13 | Third switch |
| S14 | Fourth switch |
| CS0 | First capacitor |
| CS1 | Second capacitor |
| C1–C3 | Feedback capacitances in the first analog integrator circuit |
| C4–C6 | Feedback capacitances in the second analog integrator circuit |
| OP1 | First operational amplifier |
| OP2 | Second operational amplifier |
| VSS | Reference-ground potential |
| Vref+ | First reference voltage |
| Vref– | Second reference voltage |

What is claimed is:

1. An analog/digital converter comprising a multiplicity of analog integrator circuits and also a 1-bit analog/digital converter and a 1-bit digital/analog converter, where the multiplicity of analog integrator circuits are connected in series, and the 1-bit analog/digital converter is connected downstream of the last analog integrator circuit in the series, where an output signal from the 1-bit analog/digital converter is supplied to the 1-bit digital/analog converter and an output signal from the 1-bit digital/analog converter is subtracted from an input signal of each analog integrator circuit, and where a multiplicity of input signals are supplied via a multiplexer to the first analog integrator circuit from the analog integrator circuits connected in series, wherein:

each analog integrator circuit has a multiplicity of capacitances in accordance with the multiplicity of input signals;

in each analog integrator circuit, a respective capacitance from the multiplicity of capacitances can be connected between an output and an input of an operational amplifier;

the output signal from the 1-bit digital/analog converter is delayed in accordance with the multiplicity of input signals;

the output signal from the 1-bit digital/analog converter is delayed by a shift register, the shift register having a multiplicity of outputs in accordance with the multiplicity of analog integrator circuits; and the shift register is clocked by a clock signal, and the clock signal clocks, in parallel, a multiplicity of sampling switches which are connected upstream of the analog integrator circuits, and the clock signal causes a respective capacitance from the multiplicity of capacitances to be connected between an output and an input of the operational amplifier in each analog integrator circuit.

2. The analog/digital converter as claimed in claim 1, wherein the multiplicity of outputs of the shift register are each delayed with respect to one another by one clock period of the clock signal.

3. The analog/digital converter as claimed in claim 2, wherein a first output from the multiplicity of outputs of the shift register is delayed by clock periods in accordance with the number of input signals reduced by one, and each further output from the multiplicity of outputs of the shift register is delayed by one respective further clock period.

4. The analog/digital converter as claimed claim 3, wherein the multiplicity of capacitances in each analog integrator circuit have respective identical capacitance values.

5. The analog/digital converter as claimed in claim 3, wherein the gain factor of each analog integrator circuit is determined by the ratio of a capacitance connected upstream of the input of the operational amplifier and a capacitance from the multiplicity of capacitances.

6. The analog/digital converter as claimed claim 3, wherein the capacitance values of the multiplicity of capacitances in the first analog integrator circuit are larger than the capacitance values of the multiplicity of capacitances in the other analog integrator circuits.

7. The analog/digital converter as claimed claim 2, wherein the multiplicity of capacitances in each analog integrator circuit have respective identical capacitance values.

8. The analog/digital converter as claimed in claim 2, wherein the gain factor of each analog integrator circuit is determined by the ratio of a capacitance connected upstream of the input of the operational amplifier and a capacitance from the multiplicity of capacitances.

9. The analog/digital converter as claimed claim 2, wherein the capacitance values of the multiplicity of capacitances in the first analog integrator circuit are larger than the capacitance values of the multiplicity of capacitances in the other analog integrator circuits.

10. The analog/digital converter as claimed in claim 1, wherein the gain factor of each analog integrator circuit is determined by the ratio of a capacitance connected upstream of the input of the operational amplifier and a capacitance from the multiplicity of capacitances.

11. The analog/digital converter as claimed in claim 10, wherein the gain factor of each analog integrator circuit is 0.5.

12. The analog/digital converter as claimed claim 11, wherein the capacitance values of the multiplicity of capacitances in the first analog integrator circuit are larger than the capacitance values of the multiplicity of capacitances in the other analog integrator circuits.

13. The analog/digital converter as claimed claim 10, wherein the capacitance values of the multiplicity of capacitances in the first analog integrator circuit are larger than the capacitance values of the multiplicity of capacitances in the other analog integrator circuits.

14. The analog/digital converter as claimed claim 1, wherein the multiplicity of capacitances in each analog integrator circuit have respective identical capacitance values.

15. The analog/digital converter as claimed in claim 14, wherein the gain factor of each analog integrator circuit is determined by the ratio of a capacitance connected upstream of the input of the operational amplifier and a capacitance from the multiplicity of capacitances.

16. The analog/digital converter as claimed claim 14, wherein the capacitance values of the multiplicity of capacitances in the first analog integrator circuit are larger than the capacitance values of the multiplicity of capacitances in the other analog integrator circuits.

17. The analog/digital converter as claimed claim 1, wherein the capacitance values of the multiplicity of capacitances in the first analog integrator circuit are larger than the capacitance values of the multiplicity of capacitances in the other analog integrator circuits.

* * * * *

UNITED STATES PATENT AND TRADEMARK OFFICE
CERTIFICATE OF CORRECTION

PATENT NO.     : 6,340,945 B1
DATED          : January 22, 2002
INVENTOR(S)    : J. Hauptmann et al.

It is certified that error appears in the above-identified patent and that said Letters Patent is hereby corrected as shown below:

<u>Title page,</u>
Item [30], Foreign Application Priority Data, "198 57 042" should be
-- 198 57 042.2 --.

Signed and Sealed this

Twenty-sixth Day of November, 2002

*Attest:*

*Attesting Officer*

JAMES E. ROGAN
*Director of the United States Patent and Trademark Office*